(12) United States Patent
Chan et al.

(10) Patent No.: US 8,455,901 B2
(45) Date of Patent: Jun. 4, 2013

(54) LED UNIT HAVING SELF-CONNECTING LEADS

(75) Inventors: Shiun-Wei Chan, Hsinchu (TW); Chih-Hsun Ke, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 103 days.

(21) Appl. No.: 13/178,518

(22) Filed: Jul. 8, 2011

(65) Prior Publication Data

US 2012/0074436 A1    Mar. 29, 2012

(30) Foreign Application Priority Data

Sep. 28, 2010    (CN) .......................... 2010 1 0295046

(51) Int. Cl.
*H01L 33/00*    (2010.01)

(52) U.S. Cl.
USPC ........ 257/98; 257/432; 257/E25.032; 438/29; 362/249.03; 362/249.07

(58) Field of Classification Search
USPC .. 257/98, 99, 432, 433, E25.032; 438/25–29; 362/249.03, 249.07
See application file for complete search history.

(56) References Cited

U.S. PATENT DOCUMENTS 6,707,247 B2 *    3/2004    Murano ......................... 313/501
7,726,839 B2 *    6/2010    Chien ....................... 362/249.03
7,832,897 B2 *    11/2010    Ku ............................ 362/249.02

* cited by examiner

*Primary Examiner* — David Vu
(74) *Attorney, Agent, or Firm* — Altis Law Group, Inc.

(57) ABSTRACT

An LED unit includes a plurality of LEDs connected to each other and a plate supporting the LEDs. Each LED includes a base, a chip mounted on the base, a pair of leads fixed to the base and electrically connected to the chip and an encapsulant sealing the chip. The base includes a main body and a pair of steps. The leads each have two opposite ends protruding from two opposite ends of the main body and located below/above a corresponding step. The protruding ends of the leads of each LED are connected to those of adjacent LEDs to electrically connect the LEDs in series or in parallel.

18 Claims, 7 Drawing Sheets

# LED UNIT HAVING SELF-CONNECTING LEADS

BACKGROUND

1. Technical Field

The present disclosure relates to an LED (light emitting diode) unit, and more particularly, to an LED unit having self-connecting leads.

2. Description of Related Art

As new type light source, LEDs are widely used in various applications. A conventional LED includes a base, a pair of leads fixed in the base, a chip mounted on the base and electrically connected to the leads and an encapsulant secured to the base and sealing the chip. Generally, multiple LEDs are mounted to a printed circuit board. The printed circuit board has electrical circuits to which the leads of the LEDs are soldered, thereby achieving various electrical connections of the LEDs.

However, since the pattern of the electrical circuits of the printed circuit board is fixed, the LEDs can only be connected with each other complying the pattern of the electrical circuits. As soon as the electrical connection relations between the LEDs are required to be changed for other applications, the pattern of the electrical circuits of the printed circuit board have to be redesigned and the printed circuit board needs to be remanufactured. Such redesign and remanufacture results in increase of the cost and waste of the time.

What is needed, therefore, is an LED unit having self-connecting leads which can overcome the limitations described above.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION OF THE EMBODIMENTS

Figure 1:
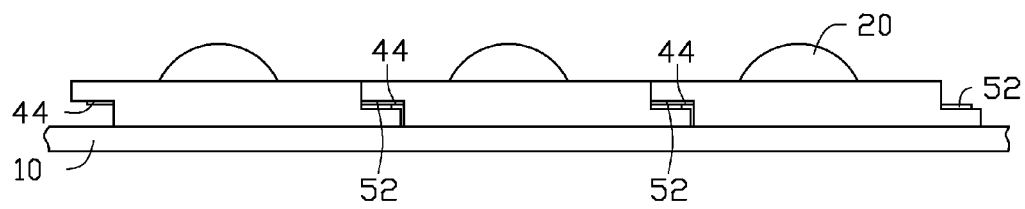
FIG. 1 is a side view of an LED unit of an embodiment of the present disclosure.

Referring to FIG. 1, an LED (light emitting diode) unit in accordance with an embodiment of the present disclosure is shown. The LED unit includes a plate 10 and a plurality of LEDs 20 mounted on the plate 10.

The plate 10 may be made of a heat conductive material, such as metal, ceramic or other suitable materials, whereby heat generated by the LEDs 20 can be effectively absorbed and dissipated by the plate 10. The plate 10 has a flat top face on which the LEDs 20 are mounted.

Figure 2:
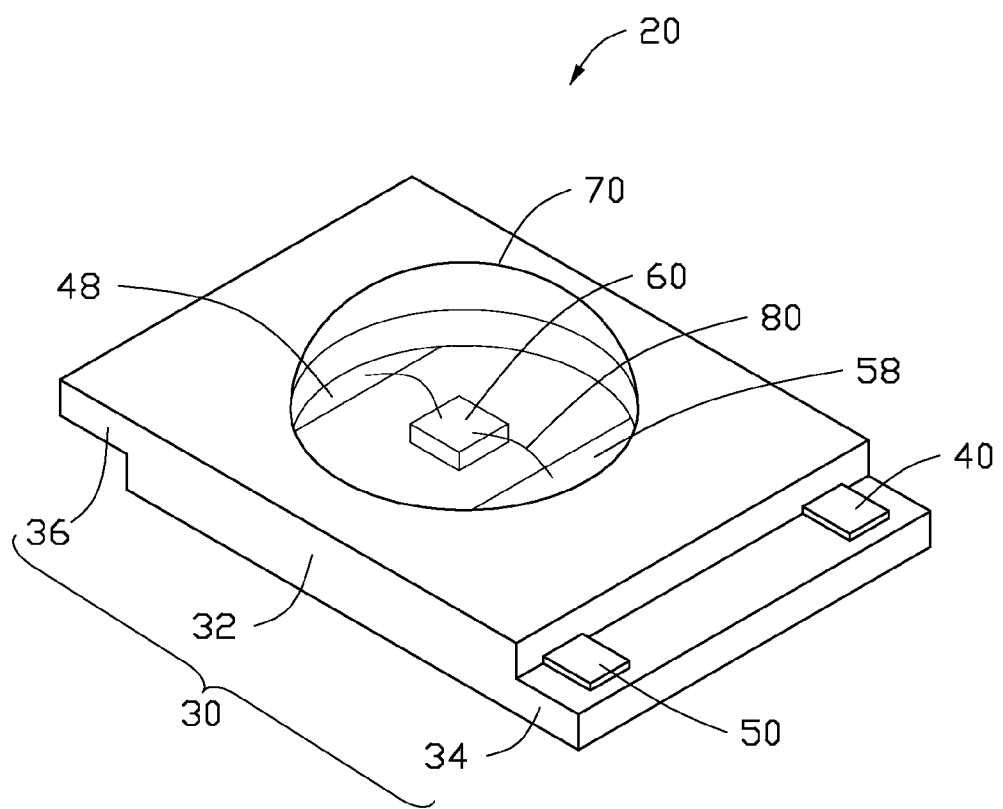
FIG. 2 is an isometric view of an LED of the LED unit of FIG. 1.
Figure 3:
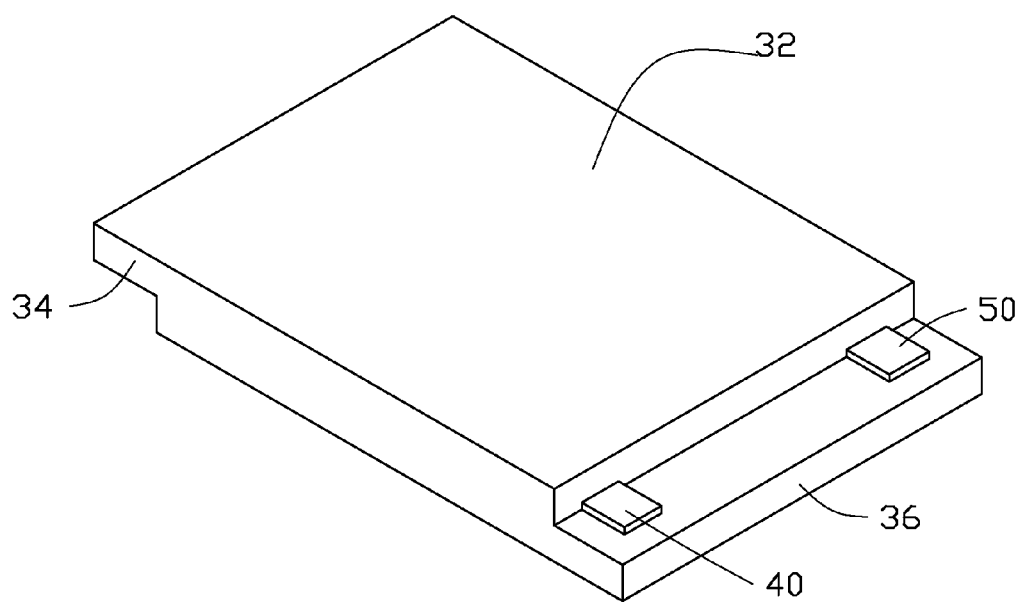
FIG. 3 is an inverted view of the LED of FIG. 2.
Figure 4:
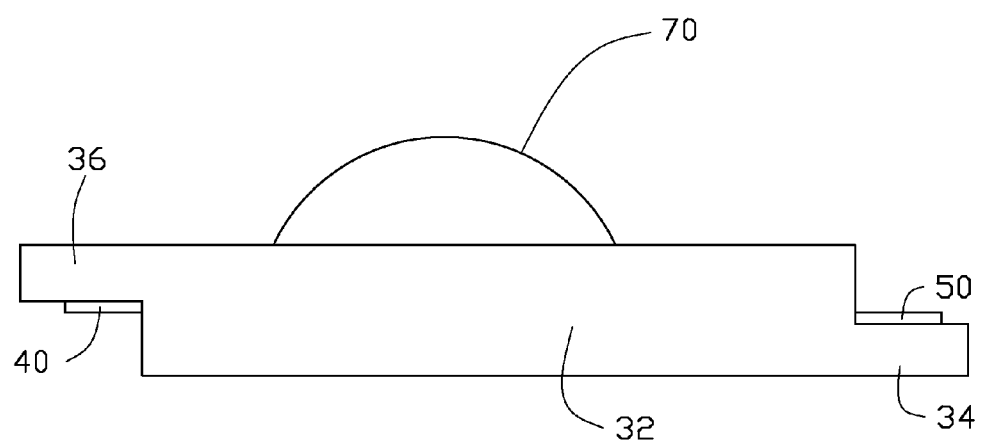
FIG. 4 is a side view of the LED of FIG. 2.

Also referring to FIGS. 2-4, each LED 20 includes a base 30, a pair of leads 40, 50 fixed to the base 30, a chip 60 mounted on the base 30 and electrically connected to the leads 40, 50 and an encapsulant 70 attached to the base 30 and sealing the chip 60. The base 30 may be made of an electrically-insulating and heat-conducting material such as ceramic. The base 30 includes a main body 32 and a first step 34 and a second step 36 protruding from two opposite ends of the main body 32. The first step 34 faces upwardly while the second step 36 faces downwardly. The main body 32 has a circular depression (not labeled) defined in a top face thereof to receive the chip 60 therein. The first step 34 is extended horizontally from a lower portion of a front end of the main body 32, leaving an upper portion of the front end of the main body 32 exposed. The second step 36 is extended horizontally from an upper portion of a rear end of the main body 32, leaving a lower portion of the rear end of the main body 32 exposed. The first step 34 and the second step 36 are complementary to each other.

Figure 5:
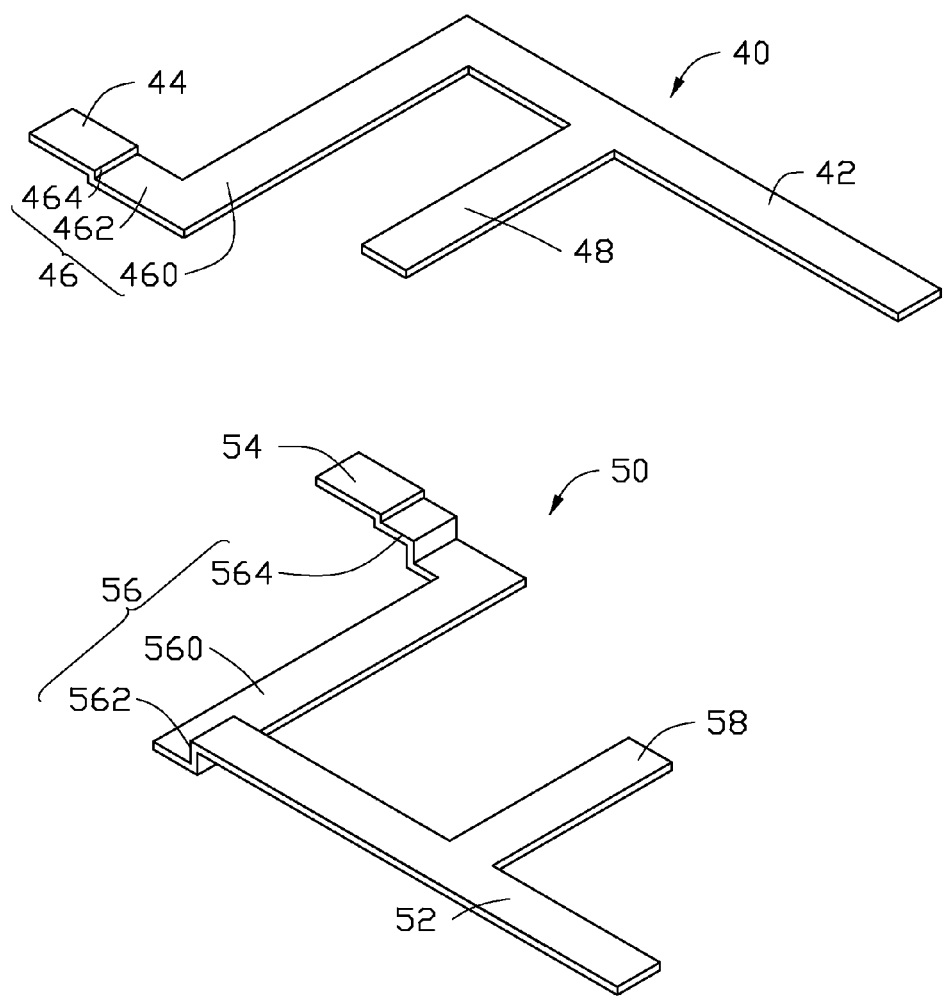
FIG. 5 is an exploded view showing a pair of leads of the LED of FIG. 2.
Figure 6:
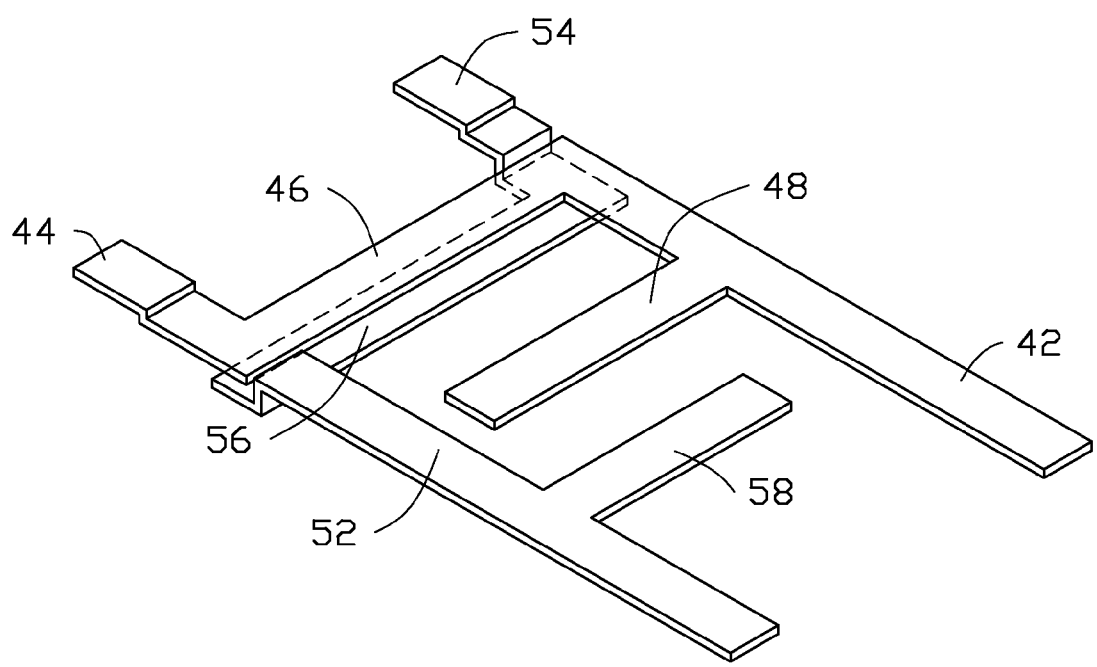
FIG. 6 shows an assembled status of the pair of leads of the LED of FIG. 5.

Also referring to FIGS. 5-6, the pair of leads 40, 50 each are made of an electrically conductive material such as copper, aluminum or other suitable metals. The pair of leads 40, 50 include a first lead 40 and a second lead 50 spaced from each other. Each of the first lead 40 and the second lead 50 includes a first contact section 42, 52, a second contact section 44, 54 and a connection section 46, 56 connecting the first contact section 42, 52 with the second contact section 44, 54. The first contact section 42 of the first lead 40 has a strip-shaped configuration extending along a front-to-rear direction of the base 30. The second contact section 44 of the first lead 40 also extends along the front-to-rear direction of the base 30. The second contact section 44 of the first lead 40 has a length less than that of the first contact section 42 and a width substantially equal to that of the first contact section 42. The second contact section 44 of the first lead 40 is located higher than the first contact section 42. The connection section 46 of the first lead 40 includes a beam 460 extending perpendicularly from a rear end of the first contact section 42, a wall 464 extending downwardly from a front end of the second contact section 44 and a piece 462 interconnecting the beam 460 and the wall 464. The beam 460 and the piece 462 are coplanar with the first contact section 42. The piece 462 is perpendicular to the beam 460 and parallel to the first contact section 42. The piece 462 has a length less than that of the beam 460 and the first contact section 42. The wall 464 is perpendicular to the second contact section 44 and the piece 462. The wall 464 has a small height so that the second contact section 44 is raised a little higher than the first contact section 42.

The first contact section 52 and the second contact section 54 of the second lead 50 have the same shapes as those of the first contact section 42 and the second contact section 44 of the first lead 40, respectively. The first contact section 52 of the second lead 50 is parallel to and coplanar with the first contact section 42 of the first lead 40, and the second contact section 54 of the second lead 50 is parallel to and coplanar with the second contact section 44 of the first lead 40. The first contact section 52 of the second lead 50 is spaced a small gap from a front side of the beam 460 of the first lead 40, preventing direct contact between the first lead 40 and the second lead 50. The connection section 56 of the second lead 50 is located below and spaced a distance from the connection section 46 of the first lead 40, whereby the connection section 56 does not contact with the connection section 46. The connection section 56 of the second lead 50 includes a piece 562 extending downwardly from a rear end of the first contact section 52, a wall 564 extending downwardly from a front end of the second contact section 54 and a beam 560 interconnecting the piece 562 and the wall 564. The wall 564 has a shape of an inverted "L". The piece 562 is oriented vertically and has a height larger than that of the wall 464 of the first lead 40. The beam 560 is located lower than the first contact section 52. The beam 560 of the second lead 50 is parallel to and located just below the beam 460 of the first lead 40. The wall 564 of the second lead 50 is bent plural times from the second contact section 54 to the beam 560. The wall 564 of the second lead 50 is spaced a small distance from a rear side of the beam 460 of the first lead 40, preventing direct contact between the first lead 40 and the second lead 50.

The first lead 40 and the second lead 50 each include an arm 48, 58 extending perpendicularly from the first contact section 42, 52 thereof, wherein the arm 48 of the first lead 40 is extended from a position adjacent to the rear end of the first contact section 42 towards the first contact section 52 of the second lead 50, and the arm 58 of the second lead 50 is extended from a position adjacent to a front end of the first contact section 52 towards the first contact section 42 of the first lead 40.

The first lead 40 and the second lead 50 are both embedded within the base 30. The first contact section 42 of the first lead 40 and the second contact section 54 of the second lead 50 are both located at the right side of the base 30, and the first contact section 52 of the second lead 50 and the second contact section 44 of the first lead 40 are both located at the left side of the base 30. Front ends of the first contact sections 42, 52 of the first lead 40 and the second lead 50 protrude out of the main body 32 and are exposed upwardly on a top face of the first step 34. Rear ends of the second contact sections 44, 54 of the first lead 40 and the second lead 50 protrude out of the main body 32 and are exposed downwardly on a bottom face of the second step 36. The beams 48, 58 of the first lead 40 and the second lead 50 are partially exposed within the depression.

The chip 60 is received in the depression and electrically connected to the two partially exposed beams 48, 58 through two wires 80. The chip 60 may be made of GaN, InGaN, InAlGaN, GaAs or other suitable light emitting semiconductor materials, depending on the actual requirements regarding the light color.

The encapsulant 70 is filled within the depression and protrudes upwardly as a dome. The encapsulant 70 can protect the chip 60 and the wires 80 from foreign object in an outside environment around the LED 20, for example, moisture or dust.

The LEDs 20 are directly connected to each other in series such that the exposed front end of the first contact section 42 of the first lead 40 of each LED 20 connects, by soldering, the exposed rear end of the second contact section 54 of the second lead 50 of an adjacent LED 20, and the exposed front end of the first contact section 52 of the second lead 50 of each LED 20 connects, by soldering, the exposed rear end of the second contact section 44 of the first lead 40 of the adjacent LED 20. When the LEDs 20 are required to emit light, the exposed front end of the first contact section 42 of the first lead 40 of the first one of the LEDs 20 is electrically connected to a positive electrode of a power source, and the exposed rear end of the second contact section 54 of the second lead 50 of the last one of the LEDs 20 is electrically connected to a negative electrode of the power source, thereby introducing a power from the power source to flow through the LEDs 20 to activate the LEDs 20 to lighten.

Figure 7:
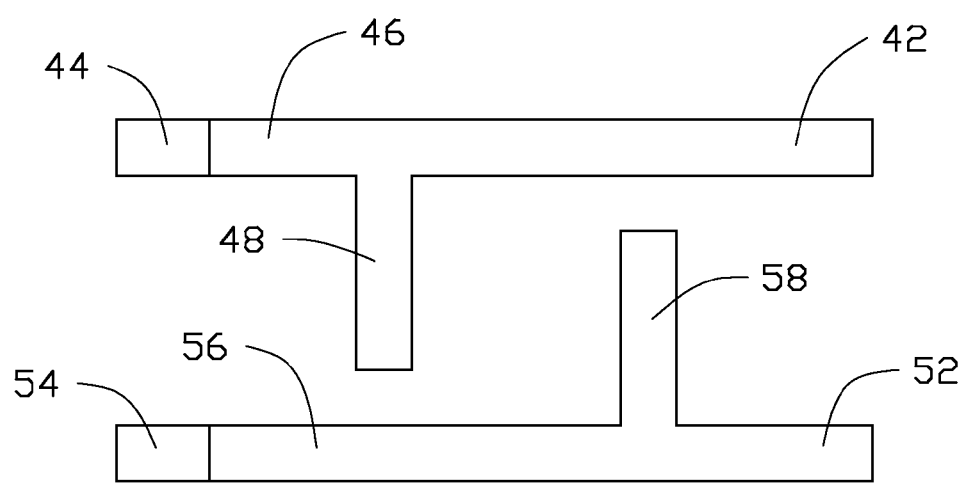
FIG. 7 is a top view of a pair of leads of an LED of the LED unit in accordance with another embodiment of the present disclosure.

Such series connection relation between the LEDs 20 can be varied to parallel connection relation by changing the structures of the first lead 40 and the second lead 50. As shown in FIG. 7, the first lead 40 and the second lead 50 of this embodiment have different configurations from that of the previous embodiment, respectively, and the structures of the other elements of the LED 20 (not shown in FIG. 7), such as the base 30, the chip 60 and the encapsulant 70, are the same as those of the previous embodiment, respectively. The first lead 40 and the second lead 50 of this embodiment have similar configurations. The first lead 40 and the second lead 50 each include a first contact section 42, 52, a second contact section 44, 54 and a connection section 46, 56 interconnecting the first contact section 42, 52 and the second contact section 44, 54. The first contact section 42, the second contact section 44 and the connection section 46 of the first lead 40 are all located at the right side of the base 30, while the first contact section 52, the second contact section 54 and the connection section 56 of the second lead 50 are all located at the left side of the base 30. The first contact section 42 of the first lead 40 is parallel to the second contact section 44, and the first contact section 52 of the second lead 50 is parallel to the second contact section 54. The first contact sections 42, 52 of the first lead 40 and the second lead 50 are located at a same plane, and the second contact sections 44, 54 of the first lead 40 and the second lead 50 are located at another same plane higher than that of the first contact sections 42, 52. The connection sections 46, 56 of the first lead 40 and the second lead 50 are parallel to each other. The first lead 40 includes an arm 48 extending from the first contact section 42 towards the second lead 50, and the second lead 50 includes an arm 58 extending from the first contact section 52 towards the first lead 40. The chip 60 is located between the two arms 48, 58 and electrically connected thereto by the two wires 80. Adjacent LEDs 20 of this embodiment are connected to each other in the same physical connection relation as that of the previous embodiment; however, the electrical connection relation of the LEDs 20 of this embodiment is changed and different from that of the previous embodiment. In this embodiment, the first contact section 42 of the first lead 40 of the first one of the LEDs 20 is electrically connected to the positive electrode of the power source, and the first contact section 52 of the second lead 50 of the first one of the LEDs 20 is connected to the negative electrode of the power source; therefore, the LEDs 20 are connected in parallel with each other.

The LEDs 20 are self-connected with each other without using a printed circuit board, whereby the cost of the printed circuit board can be saved. Furthermore, the number of the LEDs 20 to be connected together can be arbitrarily decided, whereby the design of an LED lamp using the LED 20 can be more flexible. Furthermore, the LEDs 20 directly attached on the top face of the plate 10 can increase heat dissipation capability thereof, thereby facilitating normal operation of the LEDs 20.

It is believed that the present disclosure and its advantages will be understood from the foregoing description, and it will be apparent that various changes may be made thereto without departing from the spirit and scope of the present disclosure or sacrificing all of its material advantages, the examples hereinbefore described merely being preferred or exemplary embodiments.

What is claimed is:
1. An LED (light emitting diode) unit comprising:
a plurality of LEDs, each of the LEDs comprising:
a base comprising a main body;
a light emitting chip mounted on the main body;
a pair of leads fixed to the base and electrically connected to the light emitting chip, the pair of leads each having two ends protruding oppositely from two opposite ends of the main body, respectively; and an encapsulant attached to the base to cover the light emitting chip;

wherein the two ends of the pair of the leads protruding from one of the two opposite ends of the main body of each LED are connected to the two ends of the pair of the leads protruding from the other one of the two opposite ends of the main body of a next LED;

wherein the pair of leads comprises a first lead and a second lead, each of the first lead and the second lead comprising a first contact section, a second contact section and a connection section interconnecting the first contact section and the second contact section, the first contact sections of the first lead and the second lead protruding from the one of the two opposites ends of the main body, and the second contact sections of the first lead and the second lead protruding from the other one of the two opposite ends of the main body.

2. The LED unit of claim 1, wherein the base further comprises a first step and a second step extending oppositely from the two opposite ends of the main body, the ends of the pair of leads are exposed on the first step and the second step, respectively.

3. The LED unit of claim 2, wherein the first step is extended from a lower portion of the one of the two opposite ends of the main body, and the two ends of the pair of leads protruding from the one of the two opposite ends of the main body are located on a top face of the first step.

4. The LED unit of claim 3, wherein the second step is extended from an upper portion of the other one of the two opposite ends of the main body, and the two ends of the pair of leads protruding from the other one of two opposite ends of the main body are located on a bottom face of the second step.

5. The LED unit of claim 4, wherein the first step of each LED is complementary with the second step of an adjacent LED.

6. The LED unit of claim 1, wherein the first contact section of the first lead is parallel to and coplanar with the first contact section of the second lead, and the second contact section of the first lead is parallel to and coplanar with the second contact section of the second lead.

7. The LED unit of claim 6, wherein the first contact section of the first lead is located lower than the second contact section of the first lead.

8. The LED unit of claim 1, wherein the first lead comprises an arm extending from the first contact section thereof towards the first contact section of the second lead, and the second lead comprises an arm extending from the first contact section thereof towards the first contact section of the first lead.

9. The LED unit of claim 8, wherein the arm of the first lead is perpendicular to the first contact section of the first lead, and the arm of the second lead is perpendicular to the first contact section of the second lead.

10. The LED unit of claim 8, wherein the main body defines a depression in a top face thereof, and the arms of the first lead and the second lead are partially exposed within the depression and electrically connected to the light emitting chip.

11. The LED unit of claim 1, wherein the first contact section and the second contact section of each of the first lead and the second lead are located at two opposite sides of the base.

12. The LED unit of claim 11, wherein the connection section of the second lead is located below and spaced a distance from the connection section of the first lead.

13. The LED unit of claim 11, wherein the LEDs are connected with each other in series.

14. The LED unit of claim 13, wherein the first contact section of the first lead of each LED is connected to the second contact section of the second lead of an adjacent LED, and the first contact section of the second lead of each LED is connected to the second contact section of the first lead of the adjacent LED.

15. The LED unit of claim 1, wherein the first contact section and the second contact section of the first lead are located at a side of the base, and the first contact section and the second contact section of the second lead are located at an opposite side of the base.

16. The LED unit of claim 15, wherein the connection sections of the first lead and the second lead are parallel to each other, the first contact section of the first lead is lower than the second contact section of the first lead, and the first contact section of the second lead is lower than the second contact section of the second lead.

17. The LED unit of claim 16, wherein the LEDs are connected to each other in parallel.

18. The LED unit of claim 16, wherein the first contact section of the first lead of each LED is connected to the second contact section of the first lead of an adjacent LED, and the first contact section of the second lead of each LED is connected to the second contact section of the second lead of the adjacent LED.

* * * * *